United States Patent
Umada et al.

(10) Patent No.: US 11,091,842 B2
(45) Date of Patent: Aug. 17, 2021

(54) ORIENTED ELECTROMAGNETIC STEEL SHEET AND METHOD FOR MANUFACTURING ORIENTED ELECTROMAGNETIC STEEL SHEET

(71) Applicant: JFE Steel Corporation, Tokyo (JP)

(72) Inventors: Takumi Umada, Tokyo (JP); Shigehiro Takajo, Tokyo (JP); Takashi Terashima, Tokyo (JP); Minoru Takashima, Tokyo (JP); Yasuyuki Hayakawa, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

(21) Appl. No.: 16/342,829

(22) PCT Filed: Oct. 17, 2017

(86) PCT No.: PCT/JP2017/037506
§ 371 (c)(1),
(2) Date: Apr. 17, 2019

(87) PCT Pub. No.: WO2018/074462
PCT Pub. Date: Apr. 26, 2018

(65) Prior Publication Data
US 2019/0256985 A1    Aug. 22, 2019

(30) Foreign Application Priority Data
Oct. 18, 2016 (JP) .............. JP2016-204163

(51) Int. Cl.
*C23F 17/00* (2006.01)
*C23C 14/06* (2006.01)
(Continued)

(52) U.S. Cl.
CPC .............. *C23F 17/00* (2013.01); *B32B 15/04* (2013.01); *C21D 3/04* (2013.01); *C21D 6/005* (2013.01);
(Continued)

(58) Field of Classification Search
CPC .............. C23C 14/0635; C23C 14/221; C23C 14/0021; C23C 14/0664; C23C 14/0641;
(Continued)

(56) References Cited

U.S. PATENT DOCUMENTS 6,287,703 B1*   9/2001   Inokuti ................ C21D 8/1277
                                                                                   148/307
9,406,437 B2   8/2016   Omura et al.
(Continued)

FOREIGN PATENT DOCUMENTS

CN    102782185 A    11/2012
CN    103069032 A    4/2013
(Continued)

OTHER PUBLICATIONS

Extended European Search Report for European Application No. 17 861 461.6, dated Jun. 24, 2019, 7 pages.
(Continued)

*Primary Examiner* — Daniel J. Schleis
*Assistant Examiner* — Kevin C T Li
(74) *Attorney, Agent, or Firm* — Ratnerprestia (57) ABSTRACT

Provided are: an oriented electromagnetic steel sheet with outstanding coating adhesion and magnetic properties after stress relief annealing; and a method for manufacturing the oriented electromagnetic steel sheet. The oriented electromagnetic steel sheet comprises: a steel sheet; a non-oxide ceramic coating disposed on the steel sheet and containing a non-oxide; and an insulating tensile coating disposed on the non-oxide ceramic coating and containing an oxide. The
(Continued)

thickness of the non-oxide ceramic coating is 0.020-0.400 μm. The thickness of the insulating tensile coating is at least 1.0 μm. The chromium content on the steel plate side of the non-oxide ceramic coating is less than 25 atomic %, and the chromium content on the insulating tensile coating side of the non-oxide ceramic coating is at least 25 atomic %.

21 Claims, 2 Drawing Sheets

(51) Int. Cl.

| | |
|---|---|
| *C22C 38/02* | (2006.01) |
| *C22C 38/04* | (2006.01) |
| *C22C 38/06* | (2006.01) |
| *C22C 38/00* | (2006.01) |
| *C22C 38/60* | (2006.01) |
| *C23D 5/02* | (2006.01) |
| *C21D 9/46* | (2006.01) |
| *C21D 8/12* | (2006.01) |
| *C21D 6/00* | (2006.01) |
| *C21D 3/04* | (2006.01) |
| *H01F 1/18* | (2006.01) |
| *B32B 15/04* | (2006.01) |
| *C23C 28/04* | (2006.01) |
| *C23C 14/00* | (2006.01) |
| *C23C 14/22* | (2006.01) |
| *C23C 16/36* | (2006.01) |
| *C23C 16/34* | (2006.01) |
| *C23C 16/32* | (2006.01) |

(52) U.S. Cl.
CPC ............ *C21D 6/008* (2013.01); *C21D 8/1222* (2013.01); *C21D 8/1261* (2013.01); *C21D 8/1283* (2013.01); *C21D 8/1288* (2013.01); *C21D 9/46* (2013.01); *C22C 38/001* (2013.01); *C22C 38/02* (2013.01); *C22C 38/04* (2013.01); *C22C 38/06* (2013.01); *C22C 38/60* (2013.01); *C23C 14/0021* (2013.01); *C23C 14/0635* (2013.01); *C23C 14/0641* (2013.01); *C23C 14/0664* (2013.01); *C23C 14/221* (2013.01); *C23C 16/32* (2013.01); *C23C 16/34* (2013.01); *C23C 16/36* (2013.01); *C23C 28/042* (2013.01); *C23D 5/02* (2013.01); *H01F 1/18* (2013.01)

(58) Field of Classification Search
CPC ......... C23C 14/58; C23C 14/32; C23C 16/32; C23C 16/34; C23C 16/36; C23C 16/56; C23C 28/042; C23C 28/04; C23C 28/00; C21D 8/1283; C21D 8/1288; C21D 8/1261; C21D 8/1222; C21D 8/12; C21D 9/46; C21D 6/008; C21D 6/005; C21D 3/04; C23F 17/00; B32B 15/04; H01F 1/18; H01F 1/16; C23D 5/02; C22C 38/60; C22C 38/06; C22C 38/04; C22C 38/02; C22C 38/001; B05D 7/24; B05D 1/28
See application file for complete search history.

(56) References Cited

U.S. PATENT DOCUMENTS

| | | |
|---|---|---|
| 10,403,417 B2 | 9/2019 | Sashi et al. |
| 2012/0305140 A1 | 12/2012 | Yamazaki et al. |
| 2014/0245926 A1* | 9/2014 | Muraki ................... C21D 9/46 |
| | | 106/286.6 |

FOREIGN PATENT DOCUMENTS

| | | | |
|---|---|---|---|
| CN | 105793466 | A | 7/2016 |
| JP | 6468425 | A | 3/1989 |
| JP | 01176034 | A | 7/1989 |
| JP | 0754155 | A | 2/1995 |
| JP | 2001032055 | A | 2/2001 |
| JP | 2003129196 | A * | 5/2003 |
| JP | 2003129196 | A | 5/2003 |
| JP | 2006261602 | A | 9/2006 |
| JP | 2012177161 | A | 9/2012 |
| KR | 100479353 | B1 | 3/2005 |

OTHER PUBLICATIONS

International Search Report and Written Opinion for International Application No. PCT/JP2017/037506, dated Nov. 21, 2017, 4 pages.
Japanese Office Action for Japanese Application No. 2018-503684, dated Mar. 13, 2018 with Concise Statement of Relevance of Office Action, 3 pages.
Korean Office Action for Korean Application No. 10-2019-7007875, dated Aug. 3, 2020, with Concise Statement of Relevance of Office Action, 6 pages.
Chinese Office Action with Search Report for Chinese Application No. 201780062746.7, dated Aug. 14, 2020, 8 pages.
Chinese Office Action with Search Report for Chinese Application No. 201780062746.7, dated Mar. 2, 2021, 7 pages.

* cited by examiner

ORIENTED ELECTROMAGNETIC STEEL SHEET AND METHOD FOR MANUFACTURING ORIENTED ELECTROMAGNETIC STEEL SHEET

CROSS REFERENCE TO RELATED APPLICATIONS

This is the U.S. National Phase application of PCT/JP2017/037506, filed Oct. 17, 2017, which claims priority to Japanese Patent Application No. 2016-204163, filed Oct. 18, 2016, the disclosures of each of these applications being incorporated herein by reference in their entireties for all purposes.

FIELD OF THE INVENTION

The present invention relates to a grain oriented electrical steel sheet and a producing method of a grain oriented electrical steel sheet.

BACKGROUND OF THE INVENTION

Grain oriented electrical steel sheets are soft magnetic materials used as materials for iron cores of transformers, generators and the like. Grain oriented electrical steel sheets are characterized in having a crystal structure in which the <001> orientation that is an easy magnetization axis of iron is highly-precisely aligned in the rolling direction of the steel sheet. The texture as above is formed through finishing annealing of a manufacturing process of a grain oriented electrical steel sheet, which finishing annealing allows crystal grains with the {110}<001> orientation referred to as the so-called Goss orientation to preferentially grow to an enormous size. Grain oriented electrical steel sheets as products are required to have such magnetic properties as high magnetic flux density and low iron loss.

The magnetic properties of grain oriented electrical steel sheets are improved by applying a tensile stress (tension) to a steel sheet surface. As one conventionally known technique of applying a tensile stress to a steel sheet, a technique in which a forsterite coating of about 2 μm thickness is formed on a steel sheet surface and another coating of about 2 μm thickness primarily composed of silicon phosphate glass is formed on the forsterite coating is typically used.

To be more specific, the silicon phosphate glass coating having a lower thermal expansion coefficient than that of the steel sheet is formed at high temperature and cooled to room temperature, whereby a tensile stress is applied to the steel sheet using a difference in thermal expansion coefficient between the steel sheet and the silicon phosphate glass coating.

This silicon phosphate glass coating also acts as an insulating coating that is indispensable for a grain oriented electrical steel sheet. Owing to the insulation, a local eddy current is prevented from being generated in the steel sheet.

A surface of the grain oriented electrical steel sheet having undergone finishing annealing is smoothed by chemical polishing or electrolytic polishing, and then a tensile stress is applied by means of the coating above the steel sheet, whereby iron loss can remarkably be decreased.

Meanwhile, the forsterite coating between the steel sheet and the silicon phosphate glass coating (insulation tension coating) forms, together with the steel sheet, a diffusion layer. Therefore, the smoothness of the steel sheet surface inevitably deteriorates. In addition, the adhesion between glass and metal is so low that a glass coating cannot be formed directly on a mirror-finished surface of a steel sheet. Thus, in the coating structure of a conventional grain oriented electrical steel sheet (steel sheet/forsterite coating/silicon phosphate glass coating), a surface of a steel sheet cannot be smoothed.

In Patent Literature 1, in order to maintain the smoothness of a steel sheet surface and also apply a large tensile stress to the steel sheet, a non-oxide ceramic coating such as TiN is formed on the steel sheet by a CVD method, a PVD method or the like. At this time, since a tensile stress applied to the steel sheet is proportional to the thickness of the non-oxide ceramic coating, the non-oxide ceramic coating is formed to have a thickness of at least 1 μm, CVD methods and PVD methods, however, cause high manufacturing costs, and accordingly, coatings are desired to have a small thickness to the utmost extent, which in turn results in a decrease in tensile stress applied to a steel sheet.

In Patent Literature 2, to compensate a decrease in tension due to such a small coating thickness or to apply a much higher tension to a steel sheet, a non-oxide ceramic coating that is as thin as 0.5 μm or thinner is formed on a steel sheet surface having been polished, and an insulation tension coating primarily composed of silicon phosphate glass is formed thereon.

Patent Literatures

Patent Literature 1: JP 01-176034 A
Patent Literature 2: JP 64-068425 A

SUMMARY OF THE INVENTION

As described above, in Patent Literature 2, a non-oxide ceramic coating that is as thin as 0.5 μm or thinner is formed. This thickness, however, still results in a too high manufacturing cost, so that this configuration is actually not employed at present.

The present inventors have first set the thickness of a non-oxide ceramic coating to not more than 0.400 μm and then studied the characteristics of the resulting grain oriented electrical steel sheet. As a result, it was found that when a demander or the like subjects the grain oriented electrical steel sheet to stress relief annealing, this sometimes causes the non-oxide ceramic coating to peel off from the associated steel sheet or results in poor magnetic properties of the grain oriented electrical steel sheet.

The present invention aims at providing a grain oriented electrical steel sheet having excellent coating adhesion property and magnetic properties after stress relief annealing, as well as a producing method thereof.

The present inventors have made an intensive study to achieve the foregoing objects and as a result found that, when a non-oxide ceramic coating with a thickness of not more than 0.400 μm and an insulation tension coating formed thereon have specific structures, the coating adhesion property and magnetic properties are both excellent even after stress relief annealing. The invention has been thus completed.

Specifically, an embodiment of the present invention provides the following [1] to [10].

[1] A grain Oriented electrical steel sheet, comprising:
a steel sheet;
a non-oxide ceramic coating containing a non-oxide and disposed on the steel sheet; and
an insulation tension coating containing an oxide and disposed on the non-oxide ceramic coating, wherein the non-oxide ceramic coating has a thickness of not less than 0.020 μm but not more than 0.400 μm, wherein the insulation tension coating has a thickness of not less than 1.0 μm, wherein an amount of Cr in the non-oxide ceramic coating on the steel sheet side is less than 25 at %, and wherein an amount of Cr in the non-oxide ceramic coating on the insulation tension coating side is not less than 25 at %.

[2] The grain oriented electrical steel sheet according to [1] above, wherein the non-oxide ceramic coating contains, as the non-oxide, at least one selected from the group consisting of a Ti-containing carbide, a Ti-containing nitride and a Ti-containing carbonitride.

[3] The grain oriented electrical steel sheet according to [1] or [2] above, wherein the non-oxide ceramic coating includes a coating A disposed on the steel sheet and a coating B disposed on the coating A, and wherein the amount of Cr in the coating A is different from the amount of Cr in the coating B.

[4] The grain oriented electrical steel sheet according to [3] above, wherein the amount of Cr in the coating A is smaller than the amount of Cr in the coating B.

[5] The grain oriented electrical steel sheet according to [3] or [4] above, wherein the amount of Cr in the coating A is less than 25 at %, and the amount of Cr in the coating B is not less than 25 at %.

[6] The grain oriented electrical steel sheet according to any one of [1] to [5] above, wherein the insulation tension coating contains silicon phosphate glass as the oxide.

[7] The grain oriented electrical steel sheet according to any one of [1] to [6] above, wherein the insulation tension coating has a thickness of not more than 5.0 μm.

[8] A grain oriented electrical steel sheet producing method of producing the grain oriented electrical steel sheet according to any one of [1] to [7] above, wherein the non-oxide ceramic coating is formed by a chemical vapor deposition method or a physical vapor deposition method.

[9] The grain oriented electrical steel sheet producing method according to [8] above, wherein the non-oxide ceramic coating is formed by the physical vapor deposition method, and wherein the physical vapor deposition method is an ion plating method involving applying bias voltage to the steel sheet to thereby accelerate ions, and the bias voltage is not higher than −50 V.

[10] The grain oriented electrical steel sheet producing method according to [8] or [9] above, wherein an application roll is used in formation of the insulation tension coating.

The present invention can provide a grain oriented electrical steel sheet having excellent coating adhesion property and magnetic properties after stress relief annealing, as well as a producing method thereof.

DETAILED DESCRIPTION OF EMBODIMENTS OF THE INVENTION

[Findings Obtained by Inventors]

A non-oxide ceramic coating with a thickness of not more than 0.400 μm was formed on a steel sheet, and an insulation tension coating made of silicon phosphate glass was formed thereon; when the resulting steel sheet was subjected to stress relief annealing, the non-oxide ceramic coating peeled off from the steel sheet in some cases. The present inventors studied on this phenomenon through many experiments and concluded as follows.

The use of the insulation tension coating made of silicon phosphate glass having a low thermal expansion coefficient is effective at increasing a tensile stress applied from the insulation tension coating to the associated steel sheet and thereby improving the magnetic properties, while the non-oxide ceramic coating and the insulation tension coating (silicon phosphate glass) react with each other at high temperature, thus generating reaction products.

After the reaction, the reaction products diffuse in the non-oxide ceramic coating from the interface between the insulation tension coating and the non-oxide ceramic coating toward the steel sheet during stress relief annealing at 800° C. for 3 hours; when the reaction products further diffuse and reach the interface between the non-oxide ceramic coating and the steel sheet, they react with Fe of the steel sheet and form precipitates. Then, during a cooling process in stress relief annealing, i.e., when a stress starts to be applied to the interface between the steel sheet and the non-oxide ceramic coating due to a difference in thermal expansion coefficient, the precipitates cannot fully receive the stress and consequently peel off from the steel sheet. Thus, the non-oxide ceramic coating peels off from the steel sheet. In other words, the coating adhesion property deteriorates.

To cope with it, the present inventors considered adjusting components of the non-oxide ceramic coating to suppress the reaction between the non-oxide ceramic coating and the insulation tension coating (silicon phosphate glass). At this time, the present inventors paid attention to the fact that a non-oxide ceramic coating made of CrN oxidizes more slowly than a non-oxide ceramic coating made of TiN.

The present inventors formed, after finishing annealing, a non-oxide ceramic coating made of a nitride containing Cr and having a thickness of not more than 0.400 μm on a steel sheet surface from which forsterite had been removed by pickling. Then, the present inventors applied a coating liquid primarily composed of a phosphate and colloidal silica by means of an application roll, baked the coating liquid in a nitrogen atmosphere to form silicon phosphate glass, and carried out stress relief annealing at 800° C. for 3 hours in a nitrogen atmosphere.

As a result, the present inventors found that the non-oxide ceramic coating does not peel off and an excellent coating adhesion property is maintained even after stress relief annealing.

When a nitride containing Cr was used for the non-oxide ceramic coating, however, the stress relief annealing at 800°

C. for 3 hours led to remarkably poor magnetic properties in some cases. The present inventors studied on this phenomenon through many experiments and concluded as follows.

Cr in the non-oxide ceramic coating diffuses into a steel sheet through stress relief annealing at 800° C. for 3 hours, and precipitates composed of Cr and Si and other precipitates composed of Cr and N (hereinafter also collectively called "Cr-based precipitates") are generated. The Cr-based precipitates hinder domain wall displacement in the steel sheet and thereby degrading the magnetic properties.

To cope with it, the present inventors considered changing the structure of the non-oxide ceramic coating to prevent Cr from diffusing into the steel sheet and suppress the generation of the Cr-based precipitates.

The present inventors formed, after finishing annealing, a non-oxide ceramic coating by a CVD method or a PVD method on a steel sheet surface from which forsterite had been removed by pickling. At this time, the present inventors intended to slow down the speed of diffusion of Cr into the steel sheet by decreasing the amount of Cr in the non-oxide ceramic coating on the steel sheet and accordingly, adjusted the amount of Cr such that the amount of Cr on the insulation tension coating side was larger than that on the steel sheet side. More specifically, the present inventors set the amount of Cr on the steel sheet side to less than 25 at % and the amount of Cr on the insulation tension coating side to not less than 25 at %.

Then, the present inventors applied a coating liquid primarily composed of a phosphate and colloidal silica by means of an application roll, followed by drying, thereafter baked the coating liquid in a nitrogen atmosphere to form silicon phosphate glass, and carried out stress relief annealing at 800° C. for 3 hours in a nitrogen atmosphere.

As a result, the present inventors found that the non-oxide ceramic coating does not peel off and excellent magnetic properties do not deteriorate even after stress relief annealing.

Figure 1:
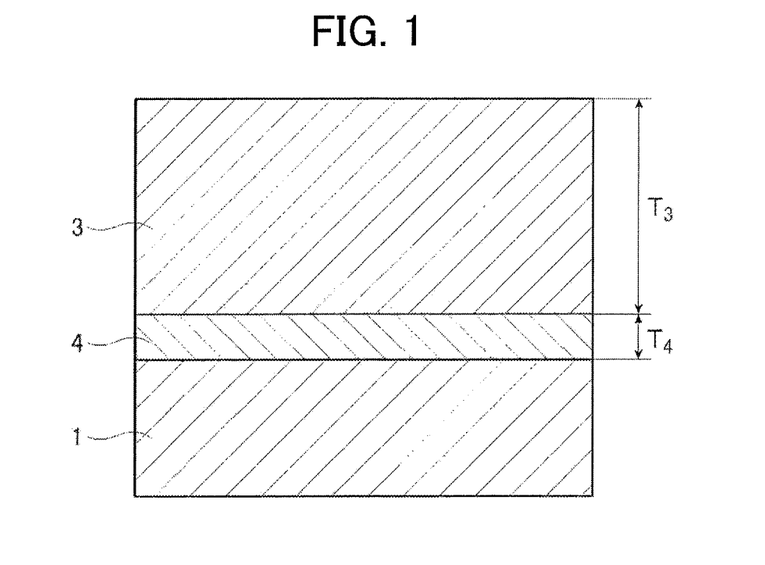
FIG. 1 is a cross-sectional view schematically showing a preferred embodiment of a grain oriented electrical steel sheet of the invention.
Figure 2:
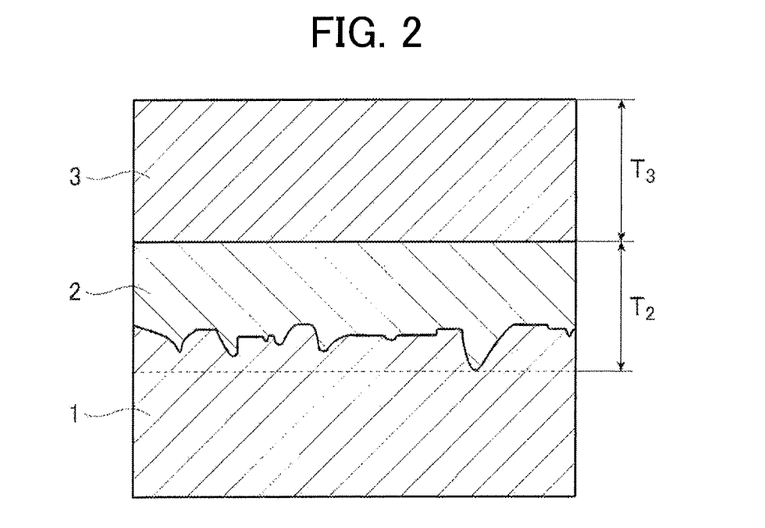
FIG. 2 is a cross-sectional view schematically showing a conventional grain oriented electrical steel sheet.

FIG. 1 is a cross-sectional view schematically showing a preferred embodiment of a grain oriented electrical steel sheet of the invention. FIG. 2 is a cross-sectional view schematically showing a conventional grain oriented electrical steel sheet.

As shown in FIG. 2, the conventional grain oriented electrical steel sheet is typically configured such that a forsterite coating 2 is disposed on a steel sheet 1 and an insulation tension coating 3 made of silicon phosphate glass is formed on the forsterite coating. In FIG. 2, the thickness $T_2$ of the forsterite coating 2 is about 2 µm, and the thickness $T_3$ of the insulation tension coating 3 is about 2 µm.

In the grain oriented electrical steel sheet according to an embodiment of the invention, the forsterite coating 2 in the conventional case (see FIG. 2) is replaced by a non-oxide ceramic coating 4 as shown in FIG. 1. In FIG. 1, the thickness $T_4$ of the non-oxide ceramic coating 4 is not more than 0.400 µm. Accordingly, even if the thickness $T_3$ of the insulation tension coating 3 is increased to a thickness of 2.0 µm or more, the effective steel sheet volume (lamination factor) of the grain oriented electrical steel sheet when used as a transformer is not decreased.

Since a tension applied from a coating to a steel sheet is proportional to the thickness of the coating, increasing the thickness of the insulation tension coating should be very effective at improving the magnetic properties of the grain oriented electrical steel sheet.

The present inventors found that, by further adjusting the rotational speed of an application roll, the specific gravity of a coating liquid, and other factors and thereby increasing the thickness of the resulting insulation tension coating, a tension applied to the associated steel sheet is increased, and thus, the resulting grain oriented electrical steel sheet can have improved magnetic properties.

In addition, the present inventors found that also when a non-oxide ceramic coating with a two-layer structure is formed on the steel sheet by first forming a coating (coating A) made of a non-oxide free from Cr, such as TiN or AlN, and then forming a coating (coating B) made of a non-oxide containing Cr thereon, excellent coating adhesion property and magnetic properties can be achieved.

In addition, the present inventors found that when a Ti-containing carbide, nitride or carbonitride is used as the non-oxide included in the non-oxide ceramic coating on the steel sheet, since the lattice spacing of the steel sheet matches that of TiN, TiC or the like well, further excellent coating adhesion property and magnetic properties can be achieved.

Further, the present inventors found the following facts. By adjusting conditions for formation of the non-oxide ceramic coating, 1) the plane orientation of the non-oxide ceramic coating is preferentially oriented such that the area fraction of portions where the inclination to the (111) plane or the (100) plane is up to 10° is at least 50% when measured by an EBSD (Electron Back Scatter Diffraction) method; or 2) in the case where the non-oxide ceramic coating is formed to have the two-layer structure (with the coating A and the coating B), the plane orientation of at least one of the two coating layers is preferentially oriented such that the area fraction of portions where the inclination to the (111) plane or the (100) plane is up to 10° is at least 50% when measured by the EBSD method.

Consequently, the low angle grain boundaries with the disorientation angle between grain boundaries in the non-oxide ceramic coating being up to 15° become dominant, so that the diffusion of phosphorus generated upon reaction between the non-oxide ceramic coating and the insulation tension coating (silicon phosphate glass) is suppressed, and thus, further excellent coating adhesion property and magnetic properties can be achieved.

[Grain Oriented Electrical Steel Sheet and Producing Method Thereof]

Again, the grain oriented electrical steel sheet of the invention is described below.

The grain oriented electrical steel sheet according to an embodiment of the invention is a grain oriented electrical steel sheet comprising a steel sheet, a non-oxide ceramic coating containing a non-oxide and disposed on the steel sheet, and an insulation tension coating containing an oxide and disposed on the non-oxide ceramic coating, wherein: the non-oxide ceramic coating has a thickness of not less than 0.020 µm but not more than 0.400 µm; the insulation tension coating has a thickness of not less than 1.0 µm; an amount of Cr in the non-oxide ceramic coating on the steel sheet side is less than 25 at %; and an amount of Cr in the non-oxide ceramic coating on the insulation tension coating side is not less than 25 at %.

The grain oriented electrical steel sheet according to an embodiment of the invention is excellent in the coating adhesion property after stress relief annealing (hereinafter also simply called "coating adhesion property") as well as in the magnetic properties after stress relief annealing (hereinafter also simply called "magnetic properties").

The grain oriented electrical steel sheet according to an embodiment of the invention is described below in further detail. The following description also covers the producing method of a grain oriented electrical steel sheet according to embodiments of the present invention.

<Steel Sheet>

The type of a steel sheet is not particularly limited, and a steel sheet described below is one example.

As the ingot that forms a steel sheet, an ingot containing, as components in steel, in percentage by mass, C in an amount from 0.002% to 0.10%, Si in an amount from 2.5% to 4.0% and Mn in an amount from 0.005% to 0.50% and also containing Al in an amount from 0.010% to 0.050% and N in an amount from 0.003% to 0.020% or Al in an amount from 0.010% to 0.050%, N in an amount from 0.003% to 0.020%, Se in an amount from 0.003% to 0.030% and/or S in an amount from 0.002% to 0.03%, with the balance being inevitable impurities and Fe is preferably used for the sake of the magnetic properties. However, the ingot for use is not limited thereto.

Such an ingot is subjected to hot rolling and then several times of cold rolling with several times of annealing performed therebetween, to thereby obtain a final cold rolled steel sheet, which is in turn subjected to decarburization annealing and finishing annealing to allow secondary recrystallized grains having the Goss orientation to develop. Thus, a steel sheet is obtained. In this process, the number of times of cold rolling is preferably up to two times for achieving the balance between the magnetic properties and the cost.

Of the foregoing components in steel, C is removed through decarburization annealing, and Al, N, Se and S are purified through finishing annealing, so that these components are to be contained in the steel sheet having undergone finishing annealing in small amounts equivalent to the amount of inevitable impurities.

Thereafter, a forsterite coating on a steel sheet surface is removed by pickling or another method.

Thus, it is preferred from the manufacturing aspect that, as conventionally carried out, a forsterite coating be formed on a steel sheet surface and thereafter removed by pickling. Although the formation of a forsterite coating is favorable for decarburization of a steel sheet, when another decarburization method is employed, a forsterite coating need not be formed.

After the forsterite coating is removed from the steel sheet surface, the steel sheet surface is smoothed by such a method as chemical polishing or electrolytic polishing.

Usually, as a steel sheet surface condition is rougher, the coating adhesion property improves owing to the anchoring effect. In contrast, as a steel sheet surface condition is smoother, a magnetic domain moves more easily, and the amount of improvement in magnetic properties when a tension is applied increases, accordingly.

In an embodiment of the present invention, even when use is made of a steel sheet having undergone chemical polishing that can smooth a steel sheet surface the most, the associated non-oxide ceramic coating does not peel off after stress relief annealing, and thus, an excellent coating adhesion property is maintained. Therefore, it is preferable to smooth a steel sheet surface to the extent possible by chemical polishing or electrolytic polishing so as to achieve an arithmetic mean roughness Ra of not more than 0.4 μm.

<Non-oxide Ceramic Coating>

The grain oriented electrical steel sheet according to an embodiment of the invention has a non-oxide ceramic coating containing a non-oxide and disposed on a surface of the steel sheet as above.

<<Amount of Cr>>

The amount of Cr in the non-oxide ceramic coating on the steel sheet side is less than 25 at % and preferably not more than 10 at % and more preferably the non-oxide ceramic coating does not contain Cr on the steel sheet side beyond the impurity level for the purpose of preventing Cr in the non-oxide ceramic coating from diffusing into the steel sheet.

On the other hand, the amount of Cr in the non-oxide ceramic coating on the insulation tension coating side is not less than 25 at %, preferably not less than 35 at % and more preferably not less than 45 at % for the purpose of achieving excellent oxidation resistance. The upper limit thereof is not particularly limited and is, for instance, not more than 70 at % and preferably not more than 60 at %.

One example of the non-oxide ceramic coating having a concentration gradient of Cr in its thickness direction is a single-layer, non-oxide ceramic coating.

In the case of the single-layer type, for example, a single-layer, non-oxide ceramic coating is formed on a steel sheet surface by a CVD method or a PVD method, and in this process, the coating is formed to have the concentration gradient in such a manner that the amount of Cr on the steel sheet side is less than 25 at % and the amount of Cr on the insulation tension coating side is not less than 25 at %.

The method of providing the concentration gradient of Cr in the non-oxide ceramic coating is not particularly limited; for instance, when a CVD method is used, the amount of Cr in a non-oxide ceramic coating to be formed can be changed by changing the nitrogen partial pressure in the atmosphere.

When a PVD method is used, for instance, the amount of Cr in a non-oxide ceramic coating to be formed can be changed by adjusting the nitrogen partial pressure in the atmosphere and/or the value of current flowing through each component.

The non-oxide ceramic coating having the concentration gradient of Cr in its thickness direction is not limited to the single-layer type as above and may be a non-oxide ceramic coating with the two-layer structure.

In this case, first, a non-oxide ceramic coating (coating A) is formed on the steel sheet, and then another non-oxide ceramic coating (coating B) being different from the coating A in the Cr content is formed on the coating A. A non-oxide ceramic coating including the coating A disposed on the steel sheet and the coating B disposed on the coating A is thus obtained.

The amount of Cr in the coating A on the steel sheet side is preferably smaller than that in the coating B on the insulation tension coating side.

To be more specific, the amount of Cr in the coating A is preferably equivalent to the amount of Cr on the steel sheet side in the case of the foregoing single-layer type coating, and the amount of Cr in the coating B is preferably equivalent to the amount of Cr on the insulation tension coating side in the case of the foregoing single-layer type coating.

A still another non-oxide ceramic coating may be disposed between the coating A and the coating B as long as the amount of Cr in the coating A is less than 25 at % and the amount of Cr in the coating B is not less than 25 at %.

The amount of Cr (unit: at %) in the non-oxide ceramic coating is determined as follows.

A process in which, after argon sputtering, AES (Auger Electron Spectroscopy) measurement is performed from the surface of the non-oxide ceramic coating formed on the steel sheet (i.e., the surface on the opposite side from the steel sheet side, that is, the surface on which the insulation tension coating is to be formed) is repeated, thereby obtaining the amounts of Cr (unit: at %) in the non-oxide ceramic coating in its thickness direction.

When the non-oxide ceramic coating is of single-layer type, "the amount of Cr on the steel sheet side" refers to the average amount of Cr contained within the steel sheet-side half of the single-layer, non-oxide ceramic coating ranging from the middle of the coating in its thickness direction. "The amount of Cr on the insulation tension coating side" refers to the average amount of Cr contained within the insulation tension coating-side half of the single-layer, non-oxide ceramic coating ranging from the middle of the coating in its thickness direction.

When the non-oxide ceramic coating includes the coating A and the coating B (i.e., has the two-layer structure), the amount of Cr contained in the coating A corresponds to "the amount of Cr on the steel sheet side," and the amount in the coating B corresponds to "the amount of Cr on the insulation tension coating side."

<<Composition>>

The non-oxide ceramic coating contains a non-oxide and is substantially made of a non-oxide.

As described above, the non-oxide ceramic coating contains Cr in an amount of not less than 25 at % on the insulation tension coating side, and thus, contains Cr at least on the insulation tension coating side. In this case, as the non-oxide present on the insulation tension coating side (the non-oxide in the coating B), at least one selected from the group consisting of a Cr-containing carbide, a Cr-containing nitride and a Cr-containing carbonitride is favorably used, for example.

On the other hand, as the non-oxide present on the steel sheet side (the non-oxide in the coating A), at least one selected from the group consisting of a Ti-containing carbide, a Ti-containing nitride and a Ti-containing carbonitride is used, for example. Examples of applicable elements other than Ti include Al, Si, Zr, Mo, Y, Nb, W, Fe, Mn, Ta, Ge and Hf. Specific examples that may be preferably employed include TiN, TiC, TiCN and TiAlN. These are excellent in lattice matching with the steel sheet and also have a lower thermal expansion coefficient compared to the steel sheet, and accordingly, can apply a higher tension. At this time, at least 10 at % of Ti is preferably contained.

According to the Arrhenius plot formulated by P. Panjan et al. (P. Panjan et al. Thin Solid Films, 281-282, (1996), 298), the addition of Ti or the like to a Cr-containing nitride can bring about increased oxidation resistance. Accordingly, non-oxides Containing three or more elements such as TiCrN and AlCrN can also be favorably used as the non-oxide.

When a non-oxide containing three or more elements is used, exemplary applicable elements other than Cr, C and N include Ti, Al, Si, Zr, Mo, Y, Nb, W, Fe, Mn, Ta, Ge and Hf.

<<Thickness>>

The thickness of the non-oxide ceramic coating is set to not more than 0.400 μm for manufacturing cost reasons. When the non-oxide ceramic coating is too thin, however, this allows the non-oxide ceramic coating to easily peel off as well as causes poor magnetic properties. Therefore, the thickness of the non-oxide ceramic coating is set to not less than 0.020 μm.

When the non-oxide ceramic coating is configured to have the two-layer structure, the thicknesses of the coating A and the coating B are each preferably set to not less than 0.010 μm but not more than 0.200 μm.

In the case of the two-layer structure, the thickness of the coating B on the insulation tension coating side is more preferably not less than 0.100 μm because this leads to a more excellent coating adhesion property.

<<Coating Formation Method>>

The method of forming the non-oxide ceramic coating is preferably a CVD (Chemical Vapor Deposition) method or a PVD (Physical Vapor Deposition) method.

A preferred CVD method is a thermal CVD method. The coating formation temperature is preferably from 900° C. to 1100° C. While the coating can be formed in the atmospheric pressure, it is preferable to reduce pressure for uniform coating formation, and thus, the pressure during coating formation is more preferably 10 to 1000 Pa for manufacturing reasons.

A preferred PVD method is an ion plating method. The coating formation temperature is preferably from 300° C. to 600° C. for manufacturing reasons. The pressure during coating formation is preferably reduced and more preferably 0.1 to 100 Pa. During the coating formation, a bias voltage of −10 to −100 V is preferably applied with the steel sheet serving as the cathode. Plasma is preferably used for ionization of a raw material because this results in a higher coating formation rate.

From the point of view of providing the concentration gradient of Cr in the non-oxide ceramic coating, CVD methods are preferred because these can easily change the amount of Cr only by changing the nitrogen partial pressure in the atmosphere.

When a non-oxide ceramic coating containing three or more elements, such as TiAlN or TiCrN, is formed as the non-oxide ceramic coating, preferred coating formation methods are PVD methods, with the ion plating method being more preferred. When a CVD method utilizing a thermodynamic reaction for coating formation is used, it is sometimes difficult to obtain a desired composition; since a PVD method ionizes an alloy material and allows the material to coherently precipitate, a desired composition can easily be obtained.

<<Orientation>>

The non-oxide ceramic coating is preferably preferentially oriented as described above; to achieve this configuration, a PVD method utilizing coherent precipitation for coating formation is more preferred than a CVD method utilizing a thermodynamic chemical reaction for coating formation.

This is because the steel sheet of the grain oriented electrical steel sheet has the texture being highly oriented in the Goss orientation {110}<001> and the non-oxide ceramic coating is easily oriented in a specific plane orientation owing to lattice matching.

Among PVD methods, the ion plating method is particularly preferred. The ion plating method is a method involving applying bias voltage to a steel sheet to thereby accelerate ions. This method is preferred because, only by decreasing the bias voltage, ions of a raw material are caused to easily move on the steel sheet, which makes it possible to easily achieve the orientation in a specific plane orientation. At this time, the bias voltage is preferably not higher than −50 V.

While the preferred orientation in the (111) plane or the (100) plane is associated with a cubic crystal, some ceramics such as AlN take on the form of a hexagonal crystal in the non-oxide ceramic coating. In this case, by aligning the plane orientation to a certain orientation, an excellent coating adhesion property should be attained as well.

<Insulation Tension Coating>

The grain oriented electrical steel sheet according to an embodiment of the invention has an insulation tension coating containing an oxide and disposed on the non-oxide ceramic coating.

<<Composition>>

One example of the oxide contained in the insulation tension coating is silicon phosphate glass.

The silicon phosphate glass content of the insulation tension coating is preferably not less than 85 mass % and more preferably 95 mass %. Even more preferably, the insulation tension coating is substantially made of silicon phosphate glass.

<<Thickness>>

Figure 3:
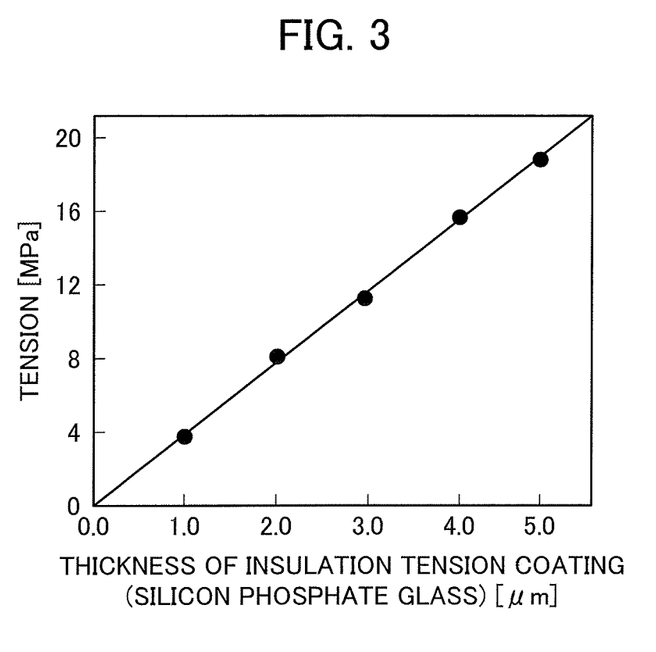
FIG. 3 is a graph showing the relationship between the thickness of an insulation tension coating made of silicon phosphate glass and the tension that the insulation tension coating with that thickness applies to the associated steel sheet.

FIG. 3 is a graph showing the relationship between the thickness of an insulation tension coating made of silicon phosphate glass and the tension that the insulation tension coating with that thickness applies to the associated steel sheet. As shown in FIG. 3, with increasing thickness of the insulation tension coating, a tension (tension stress) applied to the steel sheet increases, and this probably leads to excellent magnetic properties of the grain oriented electrical steel sheet.

The insulation tension coating has a thickness of at least 1.0 µm. With this configuration, the grain oriented electrical steel sheet can have excellent magnetic properties.

When the insulation tension coating is too thick, however, this causes a decrease in effective steel sheet volume of the grain oriented electrical steel sheet when used as a transformer, and also an iron loss reducing effect exerted by the tension stress is saturated, so that transformer properties may rather deteriorate. Thus, the insulation tension coating preferably has a thickness of not more than 5.0 µm.

<<Coating Formation Method>>

The method of forming the insulation tension coating is not particularly limited, and preferred examples thereof include a method involving applying a conventionally known coating liquid containing a phosphate and colloidal silica onto the non-oxide ceramic coating, followed by drying and then baking in a nitrogen atmosphere, thereby forming silicon phosphate glass. The insulation tension coating containing silicon phosphate glass is formed by this method.

This method is taken as an example and described below.

The coating liquid contains at least a phosphate and colloidal silica.

An exemplary metal type of the phosphate is at least one selected from the group consisting of Mg, Al, Ca, Sr, Fe, Cu, Mn and Zn.

For the phosphate, a phosphate having a low thermal expansion coefficient such as a magnesium phosphate or an aluminum phosphate is preferred. A crystal phase of a magnesium phosphate, an aluminum phosphate or the like having a low thermal expansion coefficient is formed during annealing, so that a tension applied to the steel sheet increases, resulting in further excellent magnetic properties.

As the phosphate, a primary phosphate (biphosphate) is advantageously used from the viewpoint of availability.

The colloidal silica contained in the coating liquid has an average particle size of preferably 5 to 200 nm and more preferably 10 to 100 nm. The colloidal silica content is preferably 50 to 150 parts by mass with respect to 100 parts by mass of the phosphate in terms of solid content.

The coating liquid may further contain chromic anhydride and/or bichromate, and the amount thereof is preferably 10 to 50 parts by mass with respect to 100 parts by mass of the phosphate in terms of solid content (dried product content).

Inorganic mineral particles such as silica powder or alumina powder may be further added to the coating liquid, and the amount thereof is preferably 0.1 to 10 parts by mass with respect to 100 parts by mass of the phosphate in terms of solid content.

The method of applying the coating liquid as above onto the non-oxide ceramic coating is not particularly limited and preferably utilizes an application roll for manufacturing cost reasons.

The temperature (baking temperature) and time (baking time) for baking silicon phosphate glass are preferably 700° C. to 900° C. and 10 to 30 seconds, respectively, for the following reasons.

With a baking temperature of up to 900° C. and a baking time of up to 30 seconds; a reaction between the non-oxide ceramic coating and silicon phosphate glass and the diffusion of phosphorus toward the steel sheet are suppressed, resulting in a further excellent coating adhesion property.

Silicon phosphate glass is formed through dehydration condensation of a phosphate. More specifically, a dehydration reaction is utilized in which, upon baking, a phosphate present as a primary phosphate in the coating liquid becomes pyrophosphoric acid and eventually becomes metaphosphoric acid. Accordingly, with a baking temperature of not lower than 700° C. and a baking time of not less than 10 seconds, the dehydration reaction as above sufficiently proceeds, so that moisture included in the coating liquid can adequately be removed, thus further increasing a tension stress applied from silicon phosphate glass to the steel sheet. In addition, oxidization of the non-oxide ceramic coating caused by moisture can be suppressed during stress relief annealing.

The atmosphere in which silicon phosphate glass is baked (baking atmosphere) is preferably a nitrogen atmosphere. When the baking atmosphere is an air atmosphere, the non-oxide ceramic coating is easily oxidized due to the presence of moisture, oxygen and the like contained in the air; however, in a nitrogen atmosphere, oxidization of the non-oxide ceramic coating is suppressed, resulting in a further excellent coating adhesion property.

<Stress Relief Annealing>

The grain oriented electrical steel sheet of the invention may sometimes be subjected to stress relief annealing by a demander or the like. The conditions for stress relief annealing are not particularly limited, and for instance, annealing is carried out in a nitrogen or another atmosphere at a temperature of 700° C. to 900° C. for 2 to 4 hours.

<Another Item>

To further improve the magnetic properties of the grain oriented electrical steel sheet of the invention, use may be made of the technique of refining magnetic domains of the grain oriented electrical steel sheet by forming a groove near a steel sheet surface such that the groove extends across the rolling direction of the grain oriented electrical steel sheet or by introducing a strain by laser irradiation or electron beam irradiation.

While a magnetic domain refining effect imparted by groove formation is maintained even after annealing, the degree of strain introduced by laser irradiation or electron beam irradiation is reduced through stress relief annealing carried out by a demander or the like, disadvantageously.

The grain oriented electrical steel sheet according to embodiments of the invention is, however, excellent in the coating adhesion property and magnetic properties even when no stress relief annealing is carried out. Therefore, in the present invention, when no stress relief annealing is carried out, the magnetic properties can be further improved by using the magnetic domain refining technique of introducing a strain.

EXAMPLES

The present invention will be specifically described below with reference to examples. However, the present invention is not limited thereto.

Test Example 1

<Production of Grain Oriented Electrical Steel Sheet>

A non-oxide ceramic coating and an insulation tension coating were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow secondary recrystallized grains having the Goss orientation to develop. Thus, a steel sheet was obtained.

Subsequently, a forsterite coating on a surface of the steel sheet was removed by pickling, whereafter the steel sheet surface was smoothed by chemical polishing using hydrofluoric acid. The sheet thickness after the chemical polishing was 0.20 mm.

<<Non-oxide Ceramic Coating>>

Next, a single-layer, non-oxide ceramic coating with a thickness of 0.200 μm was formed on the steel sheet by a CVD method or a PVD method. The details of the non-oxide ceramic coating are shown in Table 1 below.

For the CVD method, a thermal CVD method was used, and the coating formation was carried out under conditions at 1050° C. and 1000 Pa. For the PVD method, the ion plating method was used, and the coating formation was carried out under conditions at 450° C., 3 Pa and a bias voltage of −20 V.

The amount of Cr in the non-oxide ceramic coating was changed by changing the nitrogen partial pressure in the atmosphere in the case of the CVD method and by adjusting the nitrogen partial pressure in the atmosphere and/or the value of current flowing through each component in the case of the PVD method (the same applies in the following examples).

<<Insulation Tension Coating>>

Next, a coating liquid was applied onto the non-oxide ceramic coating with an application roll, dried, and then baked in a nitrogen atmosphere at 850° C. for 15 seconds. Thus, an insulation tension coating made of silicon phosphate glass with a thickness of 2.0 μm was formed.

For the coating liquid, used was a coating liquid containing 100 parts by mass of magnesium phosphate (magnesium phosphate monobasic), 80 parts by mass of colloidal silica (ΔT-30 manufactured by ADEKA Corporation; average particle size, 10 nm) and 20 parts by mass of chromic anhydride (the same coating liquid was also used in Test examples 2 to 4 described below).

<Evaluation>

Each of the obtained grain oriented electrical steel sheets was subjected to stress relief annealing in a nitrogen atmosphere at 800° C. for 3 hours. Thereafter, the evaluation was made as follows.

<<Coating Adhesion Property>>

The grain oriented electrical steel sheet having undergone stress relief annealing was wound around round bars having diameters different on a millimeter basis, to determine the minimum diameter (unit: mm) among diameters with which the non-oxide ceramic coating did not peel off. The results are shown in Table 1 below. As the minimum diameter of diameters with which the non-oxide ceramic coating does not peel off (i.e., no peel-off diameter). is smaller, the coating adhesion property after stress relief annealing can be rated as more excellent.

<<Iron Loss $W_{17/50}$>>

For the grain oriented electrical steel sheet having undergone stress relief annealing, the iron loss $W_{17/50}$ was measured. The results are shown in Table 1 below. For the cases where the iron loss $W_{17/50}$ was not measured, "-" was given in Table 1 below. When the iron loss $W_{17/50}$ (unit: W/kg) is less than 0.80, the magnetic properties after stress relief annealing can be rated as excellent.

TABLE 1

| | | Non-oxide ceramic coating | | | Evaluation | | |
|---|---|---|---|---|---|---|---|
| | | Amount of Cr [at %] | | | | | |
| No. | Composition | On steel sheet side | On insulation tension coating side | Coating formation method | Coating adhesion property [mm φ] | Iron loss $W_{17/50}$ [W/kg] | Remarks |
| 1 | CrN | 40 | 40 | CVD | 10 | 0.80 | Comparative example |
| 2 | CrN | 40 | 50 | CVD | 5 | 0.81 | Comparative example |
| 3 | CrN | 50 | 50 | CVD | 10 | 0.82 | Comparative example |
| 4 | CrN | 60 | 50 | CVD | 10 | 0.87 | Comparative example |
| 5 | CrN | 60 | 60 | CVD | 5 | 0.86 | Comparative example |

TABLE 1-continued

| | | Non-oxide ceramic coating | | | Evaluation | | |
|---|---|---|---|---|---|---|---|
| | | Amount of Cr [at %] | | | | | |
| No. | Composition | On steel sheet side | On insulation tension coating side | Coating formation method | Coating adhesion property [mm φ] | Iron loss $W_{17/50}$ [W/kg] | Remarks |
| 6 | TiCrN | 10 | 25 | PVD | 10 | 0.74 | Inventive example |
| 7 | TiCrN | 25 | 25 | PVD | 10 | 0.82 | Comparative example |
| 8 | TiCrN | 40 | 25 | PVD | 10 | 0.87 | Comparative example |
| 9 | AlCrN | 10 | 25 | PVD | 10 | 0.73 | Inventive example |
| 10 | AlCrN | 25 | 25 | PVD | 10 | 0.81 | Comparative example |
| 11 | AlCrN | 40 | 25 | PVD | 10 | 0.85 | Comparative example |
| 12 | TiN | 0 | 0 | CVD | Peeled off immediately after stress relief annealing | — | Comparative example |
| 13 | AlN | 0 | 0 | CVD | Peeled off immediately after stress relief annealing | — | Comparative example |

As shown in Table 1, in the examples (Nos. 12 to 13) in which a Cr-containing nitride was not used as the non-oxide constituting the non-oxide ceramic coating, the non-oxide ceramic coating peeled off immediately after stress relief annealing.

In contrast, in the examples (Nos. 1 to 11) in which a Cr-containing nitride was used as the non-oxide constituting the non-oxide ceramic coating, the no peel-off diameter was as small as 5 to 10 mm in each case, and thus, the coating adhesion property after stress relief annealing was excellent.

In particular, in examples (Nos. 6 and 9) in which the amount of Cr in the non-oxide ceramic coating was less than 25 at % on the steel sheet side and not less than 25 at % on the insulation tension coating side, the iron loss $W_{17/50}$ was less than 0.80, and thus, the magnetic properties after stress relief annealing were also excellent.

Test Example 2

<Production of Grain Oriented Electrical Steel Sheet>

A non-oxide ceramic coating and an insulation tension coating were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow secondary recrystallized grains having the Goss orientation to develop. Thus, a steel sheet was obtained.

Subsequently, a forsterite coating on a surface of the steel sheet was removed by pickling, whereafter the steel sheet surface was smoothed by chemical polishing using hydrofluoric acid. The sheet thickness after the chemical polishing was 0.20 mm.

<<Non-oxide Ceramic Coating>>

Next, by a CVD method or a PVD method, a varying non-oxide ceramic coating (coating A) with a thickness of not less than 0.005 μm but not more than 0.150 μm was formed on the steel sheet, and then a Cr-containing, non-oxide ceramic coating (coating B) with a thickness of not less than 0.005 μm but not more than 0.150 μm was formed thereon. The details of the non-oxide ceramic coatings are shown in Table 2 below. The coating A was free from Cr, so that the amount of Cr was regarded as 0 at %. The amount of Cr in the coating B was defined as 50 at %, when the composition was CrN and otherwise, defined as 25 at %.

For the CVD method, a thermal CVD method was used, and the coating formation was carried out under conditions at 1050° C. and 1000 Pa. For the PVD method, the ion plating method was used, and the coating formation was carried out under conditions at 450° C., 3 Pa and a bias voltage of −20 V.

<<Insulation Tension Coating>>

Next, a coating liquid was applied onto the non-oxide ceramic coating with an application roll, dried, and then baked in a nitrogen atmosphere at 850° C. for 15 seconds. Thus, an insulation tension coating made of silicon phosphate glass with a thickness of 2.0 μm was formed.

<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manner as in Test example 1. In each example, the non-oxide ceramic coating did not peel off immediately after stress relief annealing. The results are shown in Table 2 below.

TABLE 2

| | Non-oxide ceramic coating | | | | | | Evaluation | | |
|---|---|---|---|---|---|---|---|---|---|
| | Coating A | | | Coating B | | | Coating adhesion property [mm φ] | Iron loss $W_{17/50}$ [W/kg] | Remarks |
| No. | Composition | Thickness [μm] | Coating formation method | Composition | Thickness [μm] | Coating formation method | | | |
| 1 | TiN | 0.050 | CVD | CrN | 0.150 | CVD | 5 | 0.69 | Inventive example |
| 2 | TiN | 0.100 | CVD | CrN | 0.100 | CVD | 5 | 0.67 | Inventive example |
| 3 | TiN | 0.150 | CVD | CrN | 0.050 | CVD | 10 | 0.72 | Inventive example |
| 4 | TiN | 0.010 | CVD | CrN | 0.010 | CVD | 20 | 0.79 | Inventive example |
| 5 | TiN | 0.005 | CVD | CrN | 0.005 | CVD | 40 | 1.05 | Comparative example |
| 6 | TiN | 0.100 | PVD | TiCrN | 0.100 | PVD | 5 | 0.71 | Inventive example |
| 7 | TiN | 0.100 | PVD | AlCrN | 0.100 | PVD | 5 | 0.67 | Inventive example |
| 8 | TiN | 0.100 | PVD | SiCrN | 0.100 | PVD | 5 | 0.69 | Inventive example |
| 9 | TiN | 0.100 | PVD | ZrCrN | 0.100 | PVD | 5 | 0.72 | Inventive example |
| 10 | TiN | 0.100 | PVD | MoCrN | 0.100 | PVD | 10 | 0.71 | Inventive example |
| 11 | TiN | 0.100 | PVD | YCrN | 0.100 | PVD | 5 | 0.70 | Inventive example |
| 12 | TiN | 0.100 | PVD | NbCrN | 0.100 | PVD | 5 | 0.69 | Inventive example |
| 13 | TiN | 0.100 | PVD | WCrN | 0.100 | PVD | 10 | 0.73 | Inventive example |
| 14 | TiN | 0.100 | PVD | FeCrN | 0.100 | PVD | 10 | 0.72 | Inventive example |
| 15 | TiN | 0.100 | PVD | MnCrN | 0.100 | PVD | 10 | 0.74 | Inventive example |
| 16 | TiN | 0.100 | PVD | TaCrN | 0.100 | PVD | 5 | 0.70 | Inventive example |
| 17 | TiN | 0.100 | PVD | GeCrN | 0.100 | PVD | 10 | 0.72 | Inventive example |
| 18 | TiN | 0.100 | PVD | HfCrN | 0.100 | PVD | 10 | 0.71 | Inventive example |
| 19 | TiAlN | 0.100 | PVD | CrN | 0.100 | CVD | 5 | 0.68 | Inventive example |
| 20 | TiSiN | 0.100 | PVD | CrN | 0.100 | CVD | 5 | 0.70 | Inventive example |
| 21 | TiZrN | 0.100 | PVD | CrN | 0.100 | CVD | 5 | 0.72 | Inventive example |
| 22 | TiMoN | 0.100 | PVD | CrN | 0.100 | CVD | 5 | 0.71 | Inventive example |
| 23 | TiYN | 0.100 | PVD | CrN | 0.100 | CVD | 5 | 0.71 | Inventive example |
| 24 | TiNbN | 0.100 | PVD | CrN | 0.100 | CVD | 5 | 0.69 | Inventive example |
| 25 | TiWN | 0.100 | PVD | CrN | 0.100 | CVD | 10 | 0.72 | Inventive example |
| 26 | TiFeN | 0.100 | PVD | CrN | 0.100 | CVD | 5 | 0.69 | Inventive example |
| 27 | TiMnN | 0.100 | PVD | CrN | 0.100 | CVD | 5 | 0.69 | Inventive example |
| 28 | TiTaN | 0.100 | PVD | CrN | 0.100 | CVD | 10 | 0.71 | Inventive example |
| 29 | TiGeN | 0.100 | PVD | CrN | 0.100 | CVD | 10 | 0.73 | Inventive example |
| 30 | TiHfN | 0.100 | PVD | CrN | 0.100 | CVO | 5 | 0.72 | Inventive example |
| 31 | TiC | 0.100 | PVD | CrN | 0.100 | CVD | 5 | 0.67 | Inventive example |
| 32 | TiCN | 0.100 | PVD | CrN | 0.100 | CVD | 5 | 0.66 | Inventive example |
| 33 | AlN | 0.050 | CVD | CrN | 0.150 | CVD | 15 | 0.72 | Inventive example |
| 34 | AlN | 0.100 | CVD | CrN | 0.100 | CVD | 20 | 0.73 | Inventive example |
| 35 | AlN | 0.150 | CVD | CrN | 0.050 | CVD | 20 | 0.76 | Inventive example |
| 36 | AlN | 0.010 | CVD | CrN | 0.010 | CVD | 25 | 0.79 | Inventive example |
| 37 | AlN | 0.005 | CVD | CrN | 0.005 | CVD | 50 | 1.07 | Comparative example |
| 38 | AlN | 0.100 | PVD | TiCrN | 0.100 | PVD | 5 | 0.75 | Inventive example |
| 39 | AlN | 0.100 | PVD | AlCrN | 0.100 | PVD | 5 | 0.73 | Inventive example |

As shown in Table 2, in the examples (Nos. 1 to 4, 6 to 36 and 38 to 39) in which the thickness of the non-oxide ceramic coating (the total thickness of the coating A and the coating B) was not less than 0.020 μm, compared to the examples (No. 5 and 37) in which this thickness was 0.010 μm, the no peel-off diameter was smaller, and thus, the coating adhesion property after stress relief annealing was more excellent. In addition, in the examples (Nos. 1 to 4, 6 to 36 and 38 to 39) in which the thickness of the non-oxide ceramic coating was not less than 0.020 μm, the iron loss $W_{17/50}$ was less than 0.80, and thus, the magnetic properties after stress relief annealing were also excellent.

Comparison of the examples (Nos. 1 to 5) in which the coating A made of TiN and the coating B made of CrN constituted the two-layer structure revealed that there was a tendency in which, as the thickness of the coating B increased, the resin adhesion property and magnetic properties after stress relief annealing were more excellent.

This tendency was also seen in the examples (Nos. 33 to 37) with the two-layer structure including the coating A made of AlN and the coating B made of CrN.

Comparison of those examples (Nos. 1 to 5 and Nos. 33 to 37) revealed that there was a tendency in which the examples (No. 1 to 5) using the coating A made of TiN were more excellent than the examples (Nos. 33 to 37) using the coating A made of AlN in the resin adhesion property and magnetic properties after stress relief annealing.

Test Example 3

<Production of Grain Oriented Electrical Steel Sheet>

A non-oxide ceramic coating and an insulation tension coating were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow secondary recrystallized grains having the Goss orientation to develop. Thus, a steel sheet was obtained.

Subsequently, a forsterite coating on a surface of the steel sheet was removed by pickling, whereafter the steel sheet surface was smoothed by chemical polishing using hydrofluoric acid. The sheet thickness after the chemical polishing was 0.20 mm.

<<Non-oxide Ceramic Coating>>

Next, by a PVD method, a non-oxide ceramic coating (coating A) made of TiN with a thickness of 0.100 μm was formed on the steel sheet, and then a non-oxide ceramic coating (coating B) made of CrN with a Cr content of 50 at % and a thickness of 0.100 μm was formed thereon.

For the PVD method, the ion plating method was used, and the coating formation was carried out under conditions at 450° C. and 3 Pa. At this time, the bias voltage was changed within the range from −20 to −100 V. When the bias voltage was set to fall within the range from −50 to −100 V, the coating A and the coating B were preferentially oriented in the (111) plane or the (100) plane, individually.

The area fraction (unit: %) of portions where the inclination to the (111) plane or the (100) plane was up to 10° was measured by the EBSD method. The measurements are shown in Table 3 below. For example, when the area fraction of portions where the inclination to the (111) plane was up to 10° was 50%, this is stated as "(111), 50%" in Table 3 below.

<<Insulation Tension Coating>>

Next, a coating liquid was applied onto the non-oxide ceramic coating with an application roll, dried, and then baked in a nitrogen atmosphere at 850° C. for 15 seconds. Thus, an insulation tension coating made of silicon phosphate glass with a thickness of 2.0 μm was formed.

<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manner as in Test example 1. In each example, the non-oxide ceramic coating did not peel off immediately after stress relief annealing. The results are shown in Table 3 below.

As shown in Table 3, the examples (Nos. 2 to 5) in which the bias voltage was set to −50 V or lower were more excellent in the coating adhesion property than the example (No. 1) in which the bias voltage was not set to −50 V or lower.

Test Example 4

<Production of Grain Oriented Electrical Steel Sheet>

A non-oxide ceramic coating and an insulation tension coating were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow secondary recrystallized grains having the Goss orientation to develop. Thus, a steel sheet was obtained.

Subsequently, a forsterite coating on a surface of the steel sheet was removed by pickling, whereafter the steel sheet surface was smoothed by chemical polishing using hydrofluoric acid. The sheet thickness after the chemical polishing was 0.20 mm.

<<Non-oxide Ceramic Coating>>

Next, a non-oxide ceramic coating (coating A) made of TiN with a thickness of 0.100 μm was formed on the steel sheet by a PVD method, and then a non-oxide ceramic coating (coating B) made of CrN with a Cr content of 50 at % and a thickness of 0.100 μm was formed thereon by a PVD method.

For the CVD method, a thermal CVD method was used, and the coating formation was carried out under conditions at 1050° C. and 1000 Pa. For the PVD method, the ion

TABLE 3

| | Non-oxide ceramic coating | | | | Evaluation | | |
| --- | --- | --- | --- | --- | --- | --- | --- |
| | Coating A (TiN) | | Coating B (CrN) | | Coating | | |
| No. | Bias voltage [V] | Orientation | Bias voltage [V] | Orientation | adhesion property [mm φ] | Iron loss $W_{17/50}$ [W/kg] | Remarks |
| 1 | −20 | (111), 30% | −20 | (111), 30% | 5 | 0.67 | Inventive example |
| 2 | −50 | (111), 50% | −20 | (111), 30% | 3 | 0.67 | Inventive example |
| 3 | −20 | (111), 30% | −50 | (111), 50% | 3 | 0.67 | Inventive example |
| 4 | −50 | (111), 50% | −50 | (111), 50% | 3 | 0.67 | Inventive example |
| 5 | −100 | (100), 80% | −20 | (111), 30% | 3 | 0.66 | Inventive example |
| 6 | −20 | (111), 30% | −100 | (100), 80% | 3 | 0.66 | Inventive example |
| 7 | −100 | (100), 80% | −100 | (100), 80% | 3 | 0.66 | Inventive example | plating method was used, and the coating formation was carried out under conditions at 450° C., 3 Pa and a bias voltage of −20 V.

Next, a coating liquid was applied onto the non-oxide ceramic coating with an application roll, dried, and then baked in a nitrogen atmosphere at 850° C. for 15 seconds. Thus, an insulation tension coating made of silicon phosphate glass was formed.

At this time, the thickness of the insulation tension coating to be formed was changed within the range from 0.5 μm to 5.0 μm by changing the rotational speed of the application roll and/or the size of the roll gap.

<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manner as in Test example 1. In each example, the non-oxide ceramic coating did not peel off immediately after stress relief annealing. The results are shown in Table 4 below.

TABLE 4

| No. | Insulation tension coating Thickness [μm] | Evaluation Coating adhesion property [mm φ] | Iron loss $W_{17/50}$ [W/kg] | Remarks |
|---|---|---|---|---|
| 1 | 0.5 | 3 | 0.81 | Comparative example |
| 2 | 1.0 | 5 | 0.74 | Inventive example |
| 3 | 2.0 | 5 | 0.67 | Inventive example |
| 4 | 3.0 | 5 | 0.64 | Inventive example |
| 5 | 4.0 | 5 | 0.62 | Inventive example |
| 6 | 5.0 | 5 | 0.61 | Inventive example |

As shown in Table 4, it was revealed that, with increasing thickness of the insulation tension coating, the iron loss $W_{17/50}$ decreases, and the magnetic properties after stress relief annealing were further improved.

REFERENCE SIGNS LIST

1: steel sheet
2: forsterite coating
3: insulation tension coating
4: non-oxide ceramic coating
$T_2$: forsterite coating thickness
$T_3$: insulation tension coating thickness
$T_4$: non-oxide ceramic coating thickness

The invention claimed is:

1. A grain oriented electrical steel sheet, comprising:
a steel sheet;
a non-oxide ceramic coating containing a non-oxide and disposed on the steel sheet; and
an insulation tension coating containing an oxide and disposed on the non-oxide ceramic coating,
wherein the non-oxide ceramic coating has a thickness of not less than 0.020 μm but not more than 0.400 μm,
wherein the insulation tension coating has a thickness of not less than 2.0 μm,
wherein an amount of Cr in the non-oxide ceramic coating on the steel sheet side is less than 25 at %, and
wherein an amount of Cr in the non-oxide ceramic coating on the insulation tension coating side is not less than 25 at %.

2. The grain oriented electrical steel sheet according to claim 1,
wherein the non-oxide ceramic coating contains, as the non-oxide, at least one selected from the group consisting of a Ti-containing carbide, a Ti-containing nitride and a Ti-containing carbonitride.

3. The grain oriented electrical steel sheet according to claim 1,
wherein the non-oxide ceramic coating includes a coating A disposed on the steel sheet and a coating B disposed on the coating A, and
wherein the amount of Cr in the coating A is smaller than the amount of Cr in the coating B.

4. The grain oriented electrical steel sheet according to claim 3,
wherein the amount of Cr in the coating A is less than 25 at %, and the amount of Cr in the coating B is not less than 25 at %.

5. The grain oriented electrical steel sheet according to claim 1,
wherein the insulation tension coating contains silicon phosphate glass as the oxide, and
wherein the insulation tension coating has a thickness of not more than 5.0 μm.

6. A grain oriented electrical steel sheet producing method of producing the grain oriented electrical steel sheet according to claim 1,
wherein the non-oxide ceramic coating is formed by a chemical vapor deposition method or a physical vapor deposition method.

7. The grain oriented electrical steel sheet producing method according to claim 6,
wherein the non-oxide ceramic coating is formed by the physical vapor deposition method, and
wherein the physical vapor deposition method is an ion plating method involving applying bias voltage to the steel sheet to thereby accelerate ions, and the bias voltage is not higher than −50 V.

8. The grain oriented electrical steel sheet producing method according to claim 6,
wherein an application roll is used in formation of the insulation tension coating.

9. The grain oriented electrical steel sheet according to claim 2,
wherein the non-oxide ceramic coating includes a coating A disposed on the steel sheet and a coating B disposed on the coating A, and
wherein the amount of Cr in the coating A is smaller than the amount of Cr in the coating B.

10. The grain oriented electrical steel sheet according to claim 9,
wherein the amount of Cr in the coating A is less than 25 at %, and the amount of Cr in the coating B is not less than 25 at %.

11. The grain oriented electrical steel sheet according to claim 2,
wherein the insulation tension coating contains silicon phosphate glass as the oxide, and
wherein the insulation tension coating has a thickness of not more than 5.0 μm.

12. The grain oriented electrical steel sheet according to claim 3,
wherein the insulation tension coating contains silicon phosphate glass as the oxide, and
wherein the insulation tension coating has a thickness of not more than 5.0 μm.

13. The grain oriented electrical steel sheet according to claim 9,
   wherein the insulation tension coating contains silicon phosphate glass as the oxide, and
   wherein the insulation tension coating has a thickness of not more than 5.0 μm.

14. The grain oriented electrical steel sheet according to claim 4,
   wherein the insulation tension coating contains silicon phosphate glass as the oxide, and
   wherein the insulation tension coating has a thickness of not more than 5.0 μm.

15. The grain oriented electrical steel sheet according to claim 10,
   wherein the insulation tension coating contains silicon phosphate glass as the oxide, and
   wherein the insulation tension coating has a thickness of not more than 5.0 μm.

16. The grain oriented electrical steel sheet producing method according to claim 7,
   wherein an application roll is used in formation of the insulation tension coating.

17. The grain oriented electrical steel sheet according to claim 1, wherein the non-oxide ceramic coating is a single-layer having a concentration gradient of Cr in its thickness direction.

18. The grain oriented electrical steel sheet according to claim 1 having an iron loss $W_{17/50}$ of less than 0.80 W/Kg.

19. The grain oriented electrical steel sheet according to claim 3, wherein each of the coating A and the coating B has a thickness of not less than 0.010 μm but not more than 0.200 μm.

20. The grain oriented electrical steel sheet according to claim 1, wherein a plane orientation of the non-oxide ceramic coating is oriented such that an area fraction of portions where an inclination to a (111) plane or a (100) plane is up to 10° is at least 50% when measured by an EBSD method.

21. The grain oriented electrical steel sheet according to claim 3, wherein a plane orientation of at least one of the coating A and coating B is oriented such that an area fraction of portions where an inclination to a (111) plane or a (100) plane is up to 10° is at least 50% when measured by an EBSD method.

* * * * *